United States Patent
Avendano et al.

(10) Patent No.: US 7,277,550 B1
(45) Date of Patent: Oct. 2, 2007

(54) ENHANCING AUDIO SIGNALS BY NONLINEAR SPECTRAL OPERATIONS

(75) Inventors: Carlos Avendano, Campbell, CA (US); Michael Goodwin, Scotts Valley, CA (US); Ramkumar Sridharan, Capitola, CA (US); Martin Wolters, Nurnberg (DE)

(73) Assignee: Creative Technology Ltd., Milpitas, CA (US)

( * ) Notice: Subject to any disclaimer, the term of this patent is extended or adjusted under 35 U.S.C. 154(b) by 734 days.

(21) Appl. No.: 10/606,373

(22) Filed: Jun. 24, 2003

(51) Int. Cl.
*H03G 5/00* (2006.01)
*H04B 15/00* (2006.01)
*G10L 19/14* (2006.01)
*G10L 21/00* (2006.01)
*G10L 21/02* (2006.01)

(52) U.S. Cl. .................. 381/94.2; 381/94.1; 381/94.3; 381/98; 381/103; 704/224; 704/225; 704/226

(58) Field of Classification Search .......... 381/98, 381/103, 94.1–94.3, 94.2; 704/224, 225, 704/226
See application file for complete search history.

(56) References Cited

U.S. PATENT DOCUMENTS

| 5,878,389 | A * | 3/1999 | Hermansky et al. ........ 704/226 |
| 5,886,276 | A * | 3/1999 | Levine et al. ............... 84/603 |
| 6,098,038 | A * | 8/2000 | Hermansky et al. ........ 704/226 |
| 6,112,169 | A * | 8/2000 | Dolson ........................ 704/205 |
| 6,182,042 | B1 * | 1/2001 | Peevers ....................... 704/269 |
| 6,317,117 | B1 * | 11/2001 | Goff ............................ 345/156 |

OTHER PUBLICATIONS

Steven F. Boll. Suppression of Acoustic Noise in Speech Using Spectral Subtraction. IEEE Transactions on Acoustics, Speech and Signal Processing, vol. ASSP-27, No. 2, Apr. 1979.*
Carlos Avendano and Jean-Marc Jot: *Ambience Extraction and Synthesis from Stero Signals for Multi-Channel Audio Up-Mix*; vol. II—1957-1960: © 2002 IEEE.
Jean-Marc Jot and Carlos Avendano: *Spatial Enhancement of Audio Recordings*; AES 23rd International Conference, Copenhagen, Denmark, May 23-25, 2003.
Bosi, Marina, et al, ISO/IEC MPEG-2 advanced audio coding, AES 101, Los Angeles, Nov. 1996, J. Audio Eng. Soc., vol. 45, No. 10, Oct. 1997.

(Continued)

*Primary Examiner*—Vivian Chin
*Assistant Examiner*—Devona E. Faulk
(74) *Attorney, Agent, or Firm*—Van Pelt, Yi & James LLP

(57) ABSTRACT

A system and method are disclosed for enhancing audio signals by nonlinear spectral operations. Successive portions of the audio signal are processed using a subband filter bank. A nonlinear modification is applied to the output of the subband filter bank for each successive portion of the audio signal to generate a modified subband filter bank output for each successive portion. The modified subband filter bank output for each successive portion is processed using an appropriate synthesis subband filter bank to construct a modified time-domain audio signal. High modulation frequency portions of the audio signal may be emphasized or de-emphasized, as desired. The modification may be applied within one or more frequency bands.

32 Claims, 7 Drawing Sheets

OTHER PUBLICATIONS

Duxbury, Chris, et al, "Separation of Transient Information in Musical Audio Using Multiresolution Analysis Techniques", Proceedings of the COST G-6 Conference on Digital Audio Effects (DAFX-01), Dec. 2001.

Levine, Scott N., et al, "Improvements to the Switchland Parametric and Transform Audio Coder", Proceedings of the IEEE Workshop on Applications of Signal Processing to Audio and Acoustics, Oct. 1999, pp. 43-46.

Pan, Davis, "A Tutorial on MPEG/Audio Compression" IEEE MultiMedia, Summer, 1995.

Quatieri, T.F., et al, "Speech Enhancement Based on Auditory Spectral Change", Proceedings of the IEEE Workshop on Applications of Signal Processing to Audio and Acoustics, Oct. 1999, pp. 43-46.

Steven F. Boll. *Suppression of Acoustic Noise in Speech Using Spectral Subtraction.* IEEE Transactions on Acoustics, Speech and Signal Processing. Apr. 1979. pp. 113-120. vol. ASSP-27, No. 2.

* cited by examiner

Cut-off Modulation Frequencey

Exponent

ENHANCING AUDIO SIGNALS BY NONLINEAR SPECTRAL OPERATIONS

CROSS REFERENCE TO RELATED APPLICATIONS

This application is related to co-pending U.S. patent application Ser. No. 10/606,196 entitled TRANSIENT DETECTION AND MODIFICATION IN AUDIO SIGNALS, filed concurrently herewith, which is incorporated herein by reference for all purposes.

FIELD OF THE INVENTION

The present invention relates generally to digital signal processing. More specifically, enhancing audio signals by nonlinear spectral operations is disclosed.

BACKGROUND OF THE INVENTION

An audio signal may comprise one or more regions of relatively rapid change in spectral content, such as without limitation a transient audio event. Such regions of relatively rapid change may occur across a broad spectrum or within a more narrow range of frequencies. The perceptual experience of one listening to an audio signal may be affected by the manner in which such regions of the signal are rendered. For example, a listener may perceive an audio signal in which such rapid changes in spectral content are emphasized or enhanced as being more "edgy" or "crisp". By contrast, one may perceive an audio signal in which such rapid changes in spectral content have been smoothed or otherwise de-emphasized as being more "warm" or "smooth". Different listeners may have different preferences regarding how "edgy" or "smooth" a particular audio signal is rendered.

An analogy can be made to a visual image. In a visual image, the feature analogous to a region of rapid change in spectral content is a line defining a boundary between a region of one color and a region of a second, contrasting color. Visual image processing techniques are known to "soften" or "blur", or conversely to "sharpen", such transitions, as desired, in order to enhance the perceptual experience of a viewer in a desired manner.

Typical prior art static equalization techniques are not fully satisfactory for this purpose, as they do not respond dynamically to the audio signal being processed and may not as a result provide the desired listening experience for a given signal.

Therefore, there is a need for a way to process an audio signal to either smooth or enhance rapid changes in spectral content to provide a desired perceptual experience with respect to such changes.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

Enhancing audio signals by nonlinear spectral operations is disclosed. In one embodiment, regions of rapid change of spectral content are either enhanced or smoothed, as desired, by applying a nonlinear modification to the spectral magnitude of the Short Time Fourier Transform (STFT) for the region. The STFT of a time-domain signal represents the spectral content in the frequency domain of a series of successive frames of a time-domain audio signal, the frame being defined by the length (in time) of a "window" which extracts a portion of the time-domain signal for frequency-domain analysis. By performing the STFT operation on a chronological succession of frames, one can analyze how the spectral magnitude of a signal changes over time.

As described above, it may be desirable to enhance or smooth rapid changes in spectral content, in order to provide a desired perceptual experience, sometimes referred to as the "texture" of the audio signal as rendered, to a listener. Regions of rapid spectral change are associated with a high modulation frequency in affected frequency bands. That is, for portions of an audio signal characterized by a rapid rate of change in spectral content, as determined by comparing the STFT results for successive frames, the modulation frequency is higher than for regions of less dramatic change in spectral content. As described more fully below, in one embodiment nonlinear spectral operations are performed to enhance high modulation frequency portions of an audio signal.

Figure 1:
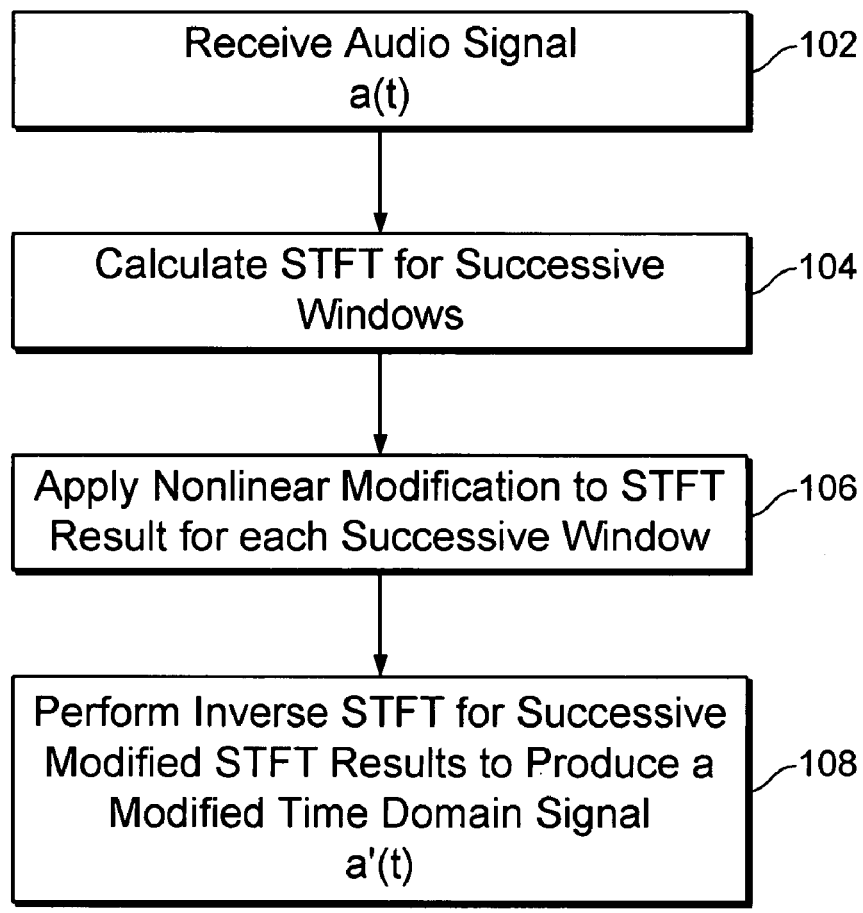
FIG. 1 is a flowchart illustrating a process used in one embodiment to enhance audio signals by nonlinear spectral operations.

FIG. 1 is a flowchart illustrating a process used in one embodiment to enhance audio signals by nonlinear spectral operations. The process begins in step 102 in which a time-domain audio signal a(t) is received. In step 104, the short time Fourier transform (STFT) is calculated for successive (and in one embodiment overlapping) portions of the time-domain signal a(t). In step 106, a nonlinear modification is applied to the STFT result for each successive portion of the time-domain audio signal a(t). In step 108, the inverse STFT is performed for the successive modified STFT results to produce a modified time-domain signal a'(t). In one embodiment, step 108 comprises performing an overlap-add operation of the inverse STFT results to make a complete time-domain signal. While the process shown in FIG. 1 specifies by way of example performing the STFT and/or inverse STFT, other subband filter blocks may be used in other embodiments.

Figure 2:
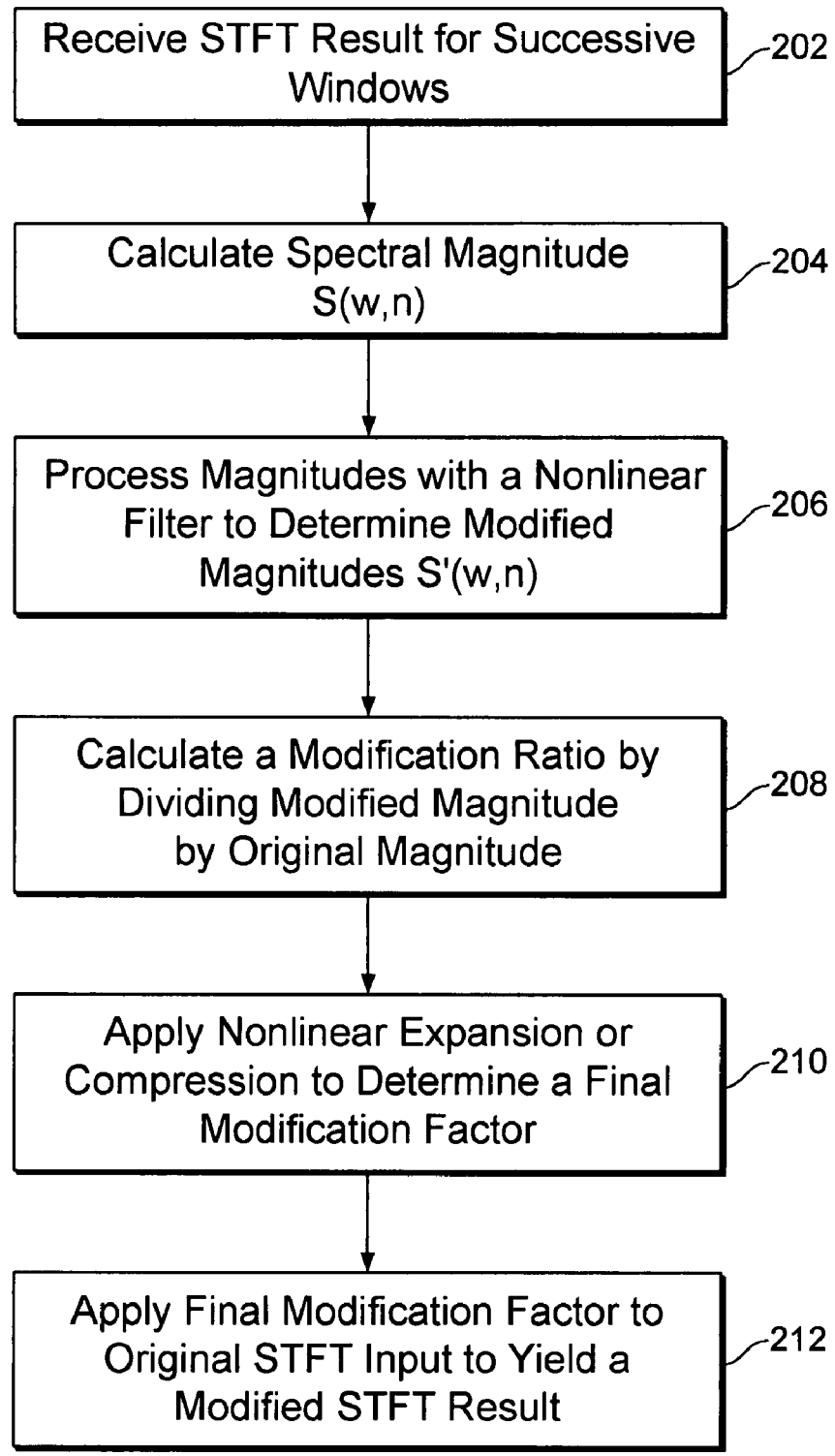
FIG. 2 is a flowchart illustrating a process used in one embodiment to apply a nonlinear modification to the STFT results for successive portions of a time-domain signal a(t), as in step 106 of the process shown in FIG. 1.

FIG. 2 is a flowchart illustrating a process used in one embodiment to apply a nonlinear modification to the STFT results for successive portions of a time-domain signal a(t), as in step 106 of the process shown in FIG. 1. In step 202, the STFT result $A(\omega,n)$ for successive frames "n" of the time-domain signal a(t) is received. In one embodiment, the successive frames "n" may overlap to a degree in the time domain. In one embodiment, as each successive STFT result is calculated, the result is received in step 202, which repeats as each successive result is received. In step 204, the spectral magnitude $S(\omega,n)$ is calculated for each successive STFT result $A(\omega,n)$ as it is received in step 202. In step 206, the spectral magnitude values $S(\omega,n)$ are processed with a nonlinear filter to determine modified spectral magnitudes $S'(\omega,n)$. In one embodiment, the nonlinear filter comprises one or more filters configured to amplify or otherwise enhance high modulation frequency portions of the audio signal. In one embodiment, the nonlinear filter comprises one or more filters configured to smooth or otherwise de-emphasize high modulation frequency portions of the audio signal. In step 208 a modification ratio is calculated by dividing the modified magnitudes $S'(\omega,n)$ by the corresponding original magnitudes $S(\omega,n)$. In step 210, a nonlinear expansion or compression, as desired, is applied to the modification ratio calculated in step 208 to determine a final modification factor. In step 212, the final modification factor determined in step 210 is applied to the original STFT results received in step 202 to yield a modified STFT result for each successive portion of the audio signal.

Figure 3:
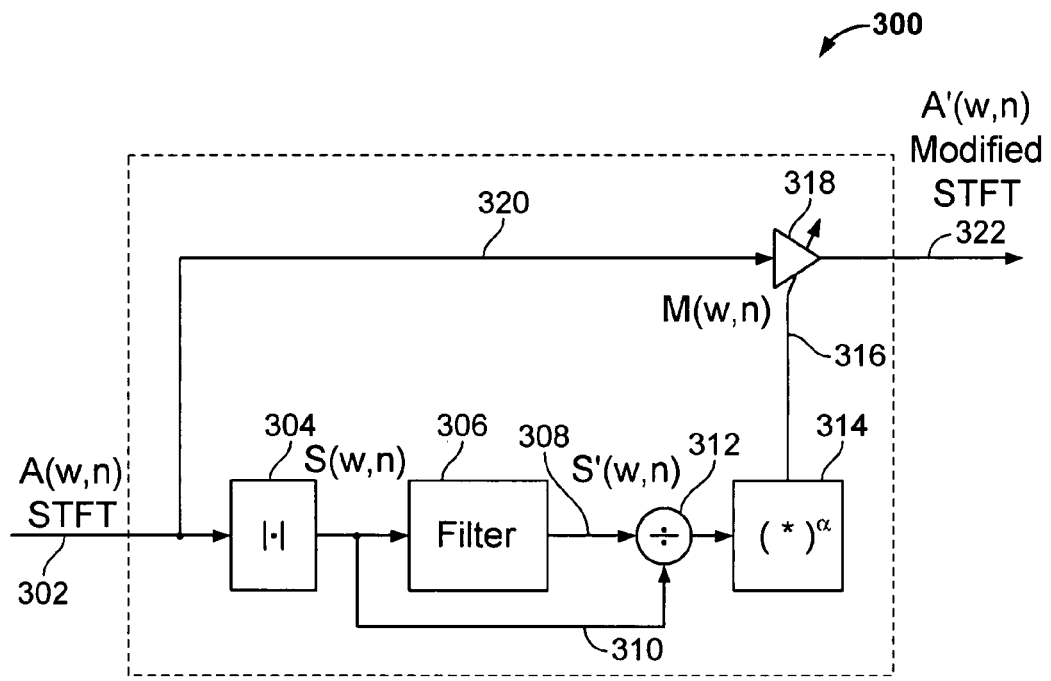
FIG. 3 is a block diagram illustrating a system used in one embodiment to apply a nonlinear modification to the STFT results A(ω,n) for successive frames "n" of a time-domain audio signal a(t), as in step 106 of the process shown in FIG. 1.

FIG. 3 is a block diagram illustrating a system used in one embodiment to apply a nonlinear modification to the STFT results $A(\omega,n)$ for successive frames "n" of a time-domain audio signal a(t), as in step 106 of the process shown in FIG. 1. The system 300 receives the STFT result $A(\omega,n)$ for successive frames "n" of the time-domain audio signal a(t) on line 302. The STFT results are provided to a magnitude determination block 304, which is configured to calculate the spectral magnitude $S(\omega,n)$ for each successive frame "n". The spectral magnitude values $S(\omega,n)$ are provided to a filter block 306. In one embodiment, the filter block 306 is configured to either enhance or de-emphasize, as desired, portions of the audio signal having a high modulation frequency relative to other portions.

The "modulation frequency" of an audio signal (or portion thereof) describes the frequency content of the time evolution of a portion of the signal spectrum such as a designated frequency bin. In one embodiment, the spectral magnitudes $S(\omega,n)$ for successive windows "n" are processed to extract the portion of each successive result that pertains to a frequency bin of interest, the frequency bin of interest being defined by an upper and lower cut-off frequency. In one such embodiment, the portions of the spectral magnitudes $S(\omega,n)$ relevant to a frequency bin $\omega_0$ for successive frames "n" comprise a time-varying spectral magnitude value $S(\omega_0,t)$ representing how the spectral content of the underlying audio signal changes over time within the frequency bin. In one embodiment, in order to identify portions of the audio signal for which the spectral content is changing rapidly, the Fourier transform is performed on the spectral magnitude values $S(\omega_0,t)$, the result of which may be represented graphically as a plot of the Fourier transform magnitude on the vertical axis and the modulation frequency, i.e., the rate at which the spectral content changes in the applicable frequency bin, on the horizontal axis, with a high value for the Fourier transform magnitude indicating a significant degree of change within the bin at the corresponding modulation frequency. In one embodiment, filter block 306 is configured to enhance (or smooth, as desired) high modulation frequency components of the audio signal (within the signal bin of interest, in one embodiment) relative to low modulation frequency components, with the result that portions of the audio signal that are associated with rapid changes in spectral content (e.g., within the frequency bin) are enhanced (or smoothed).

In one embodiment, the filter block 306 comprises a linear filter. In one embodiment, the filter block 306 comprises a nonlinear filter. In one embodiment, the filter block 306 comprises an infinite impulse response (IIR) filter. In one embodiment, the filter block 306 comprises a plurality of linear (and/or nonlinear) filters and the system is configured to switch between the filters based on one or more signal-dependent parameters, as described more fully below in connection with Equations [2] and [5] below. The filter block 306 is configured to provide to a modification ratio determination block 312 via line 308 a series of modified spectral magnitude values $S'(\omega,n)$. The original unmodified spectral magnitude values $S(\omega,n)$ generated by magnitude determination block 304 are also provided via line 310 to modification ratio determination block 312. The modification ratio determination block 312 is configured in one embodiment to divide the modified spectral magnitude values $S'(\omega,n)$ by the corresponding original, unmodified spectral magnitude values $S(\omega,n)$ to calculate a modification ratio equal to $S'(\omega,n)/S(\omega,n)$. The modification ratio $S'(\omega,n)/S(\omega,n)$ is provided to a nonlinear expansion/compression block 314. The nonlinear expansion/compression block 314 is configured in one embodiment to raise the modification ratio to an exponent $\alpha$. Whereas the filter block 306 determines the nature of the modification, e.g. smoothing or sharpening, of high modulation-frequency signal components, the extent of the smoothing or sharpening is determined both by the filter block 306 and also by the nonlinear compression/expansion block 314 by means of the exponent α. In the embodiment shown in FIG. 3, when α=0, the output of the nonlinear compression/expansion block 314 is equal to 1 and no modification occurs. For α=1, the nonlinear compression/expansion block 314 is equal to the ratio S'(ω,n)/S(ω,n) and the magnitude of the output on line 322 is that of the filter output 308. For a increasing from 0 to 1, the extent of the modification gradually increases from the former case to the latter case. For α>1, the modification effect of the filter block 306 is further amplified; in other words, the effect of either the smoothing or sharpening is further increased. In one embodiment, the value of the exponent α is determined at least in part by a user input as discussed more fully below.

The nonlinear compression/expansion block 314 provides as output on line 316 a series of modification function values M(ω,n) equal to the modification ratios received by block 314 raised to the exponent α, as indicated by the following equation [1]:

$$M(\omega, n) = \left[\frac{S'(\omega, n)}{S(\omega, n)}\right]^\alpha \quad [1]$$

In one alternative embodiment, the nonlinear compression/expansion block 314 is configured to raise only the numerator portion of the modification ratio to the exponent α, which in one such embodiment increases the effect of the modification across frequencies. In one such embodiment, the nonlinear compression/expansion block 314 is further configured to raise the entire result [S'(ω,n)]^α/S(ω,n) to a second exponent γ, which controls the amount of the modification. Those of skill in the art will recognize that nonlinear compression/expansion block 314 could be configured to perform numerous different types of nonlinear modification, and any set of processes and/or components configured to perform any such nonlinear modification may be used to implement the nonlinear compression/expansion block 314, and any such implementation is within the scope of the present disclosure.

Referring further to FIG. 3, the modification function values provided on line 316 are provided as a bias circuit input to variable gain amplifier 318. The variable gain amplifier 318 receives as input the original, unmodified STFT results received by the system 300 via line 302 and provided via line 320 to the variable gain amplifier 318. The variable gain amplifier 318 provides as output on line 322 a modified STFT result, which result has the same phase as the original STFT result received via lines 302 and 320 with the magnitude modified in accordance with the modification function received via line 316.

In one embodiment, the system 300 of FIG. 3 may be implemented by programming a processor to perform the above-described operations associated with each functional block illustrated in FIG. 3. In one embodiment, the processor may comprise a general use processor, such as may be found in a typical personal computer. In one embodiment, the processor may comprise a processor specially configured to process audio data, such as a processor comprising part of a sound card and/or an embedded digital signal processor (DSP). In one embodiment, a special purpose computer chip, such as an ASIC, may be configured to implement the system illustrated in FIG. 3. In one embodiment, one or more circuits or other hardware may be used to implement one or more portions of the system shown in FIG. 3, such as without limitation filter block 306.

Figure 4:
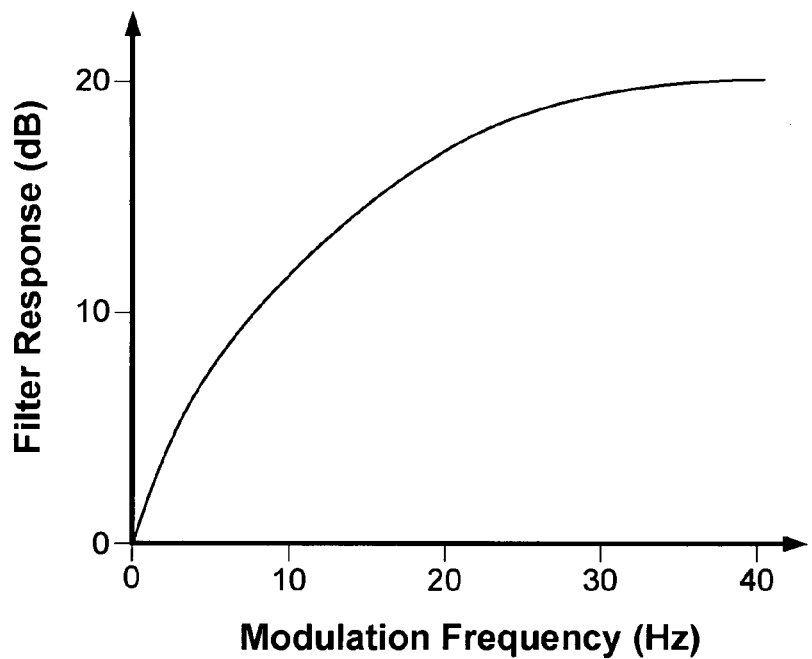
FIG. 4 illustrates the response of a linear filter such as may be used in one embodiment to determine a modified spectral magnitude for a portion of an audio signal, as in the filter block 306 of FIG. 3.

FIG. 4 illustrates the response of a linear filter such as may be used in one embodiment to determine a modified spectral magnitude for a portion of an audio signal, as in the filter block 306 of FIG. 3. In one embodiment, the filter block 306 of FIG. 3 may comprise one or more linear filters such as the one illustrated in FIG. 4, each having its own characteristics and response curve similar to the one shown in FIG. 4, with the system being configured to provide a nonlinear response by switching between the linear filters based on one or more signal-dependent parameters. As the response curve shown in FIG. 4 indicates, the associated filter would provide relatively little modification to low modulation frequency portions of the audio signal, and much greater modification to higher modulation frequency portions of the audio signal. In one embodiment, a filter having characteristics similar to those illustrated in FIG. 4 may comprise a portion of the filter block 306 of the system shown in FIG. 3, in an embodiment in which the filter block 306 may be used to enhance portions of the audio signal characterized by a high modulation frequency.

Figure 5:
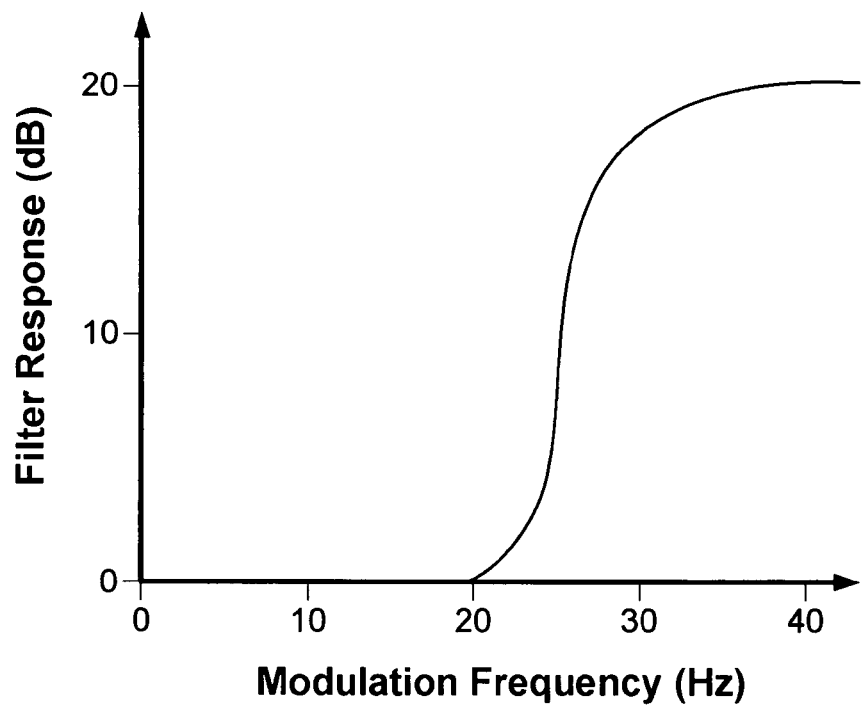
FIG. 5 is a filter response graph illustrating the characteristics of a high-shelf IIR filter, such as may be used in one embodiment to enhance the high modulation frequency portions of an audio signal.

FIG. 5 is a filter response graph illustrating the characteristics of a high-shelf IIR filter, such as may be used in one embodiment to enhance the high modulation frequency portions of an audio signal. As shown in FIG. 5, a high-shelf filter provides no modification to the portions of a signal characterized by a low modulation frequency and a relatively high degree of modification to portions characterized by a high modulation frequency. In one embodiment, a high-shelf IIR filter such as the one illustrated in FIG. 5 may be included in the filter block 306 of the system shown in FIG. 3.

Figure 6:
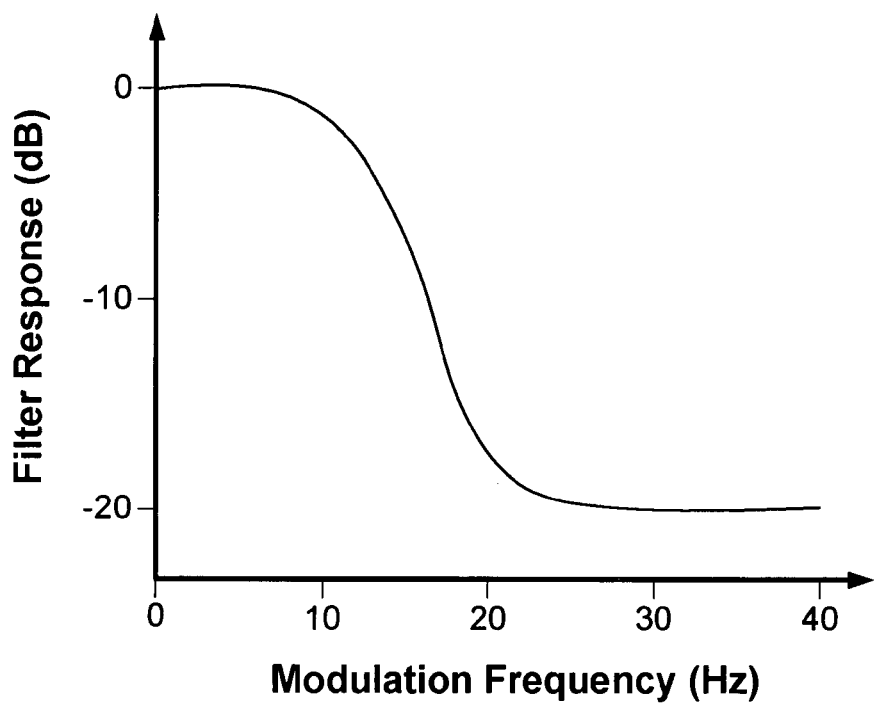
FIG. 6 illustrates the filter response of a filter used in one embodiment to smooth or otherwise de-emphasize portions of an audio signal having a high modulation frequency.

FIG. 6 illustrates the filter response of a filter used in one embodiment to smooth or otherwise de-emphasize portions of an audio signal having a high modulation frequency. In one embodiment, the filter illustrated in FIG. 6 comprises an IIR low-shelf filter. As shown in FIG. 6, the IIR low-shelf filter provides no modification to portions of the audio signal characterized by a low modulation frequency and a relatively high degree of suppression of portions of the audio signal characterized by a high modulation frequency. In one embodiment, one or more of the filters illustrated in FIGS. 4, 5, and 6, and other filters as required in a particular application, may be included in the filter block 306 of the system shown in FIG. 3, and invoked as appropriate to modify the audio signal being processed by the system 300 shown in FIG. 3, depending on whether portions of the audio signal characterized by a high modulation frequency are to be enhanced or de-emphasized, as desired.

In one embodiment, depending on the operation being performed by the filter block 306, one or more characteristics of one or more filters used to process the spectral magnitudes S(ω,n) may be determined by a user input. In one embodiment, the user input comprises a cut-off modulation frequency which is mapped to two time constant coefficients $\lambda_1$ and $\lambda_2$, which in one embodiment have different values in order to provide the characteristics of a nonlinear IIR filter. In one embodiment, where portions of the audio signal characterized by a high modulation frequency are to be de-emphasized or smoothed, the nonlinear filter applied by the filter block 306 to the successive magnitude values S(ω,n) of the STFT results received by the system 300 is characterized by the following equation [2]:

$$S'(\omega, n) = \begin{cases} \lambda_1 S'(\omega, n-1) + (1-\lambda_1)S(\omega, n) & \text{if } S(\omega, n) < S'(\omega, n-1) \\ \lambda_2 S'(\omega, n-1) + (1-\lambda_2)S(\omega, n) & \text{if } S(\omega, n) \geq S'(\omega, n-1) \end{cases} \quad [2]$$

In one embodiment, for portions of an audio signal in which high modulation frequency regions are to be enhanced, a high-pass finite impulse response (FIR) filter (i.e. a sharpener) is applied to the STFT magnitudes, in accordance with the following equation [3]:

$$S'(\omega,n) = g[(\beta-1)S(\omega,n-1) + (\beta 3+1)S(\omega,n)] \quad [3]$$

where the gain g is computed in accordance with the following equation [4]:

$$g = \frac{1}{2\beta} \quad [4]$$

and $\beta$ is in one embodiment a fixed parameter. In one alternative embodiment, $\beta$ varies based on one or more signal-dependent parameters. In one embodiment, the value of $\beta$ is within the range $0 < \beta \leq 1$.

In one embodiment, when the STFT magnitudes are enhanced in accordance with the above equation [3], the output of the high-pass FIR filter is smoothed using an IIR smoother to reduce artifacts. In one embodiment, the behavior of the smoother is similar to the IIR low-pass filter described above in equation [2] and is therefore characterized by the following equation [5]:

$$S'(\omega, n) = \begin{cases} \lambda_3 S'(\omega, n-1) + (1-\lambda_3)S(\omega, n) & \text{if } S(\omega, n) < S'(\omega, n-1) \\ \lambda_4 S'(\omega, n-1) + (1-\lambda_4)S(\omega, n) & \text{if } S(\omega, n) \geq S'(\omega, n-1) \end{cases} \quad [5]$$

In one embodiment, the respective value of the coefficients $\lambda_3$ and $\lambda_4$ in equation [5] may be determined at least in part by a user input. In one alternative embodiment, the values of the coefficients $\lambda_3$ and $\lambda_4$ are fixed and are determined in advance by a sound designer.

Figure 7:
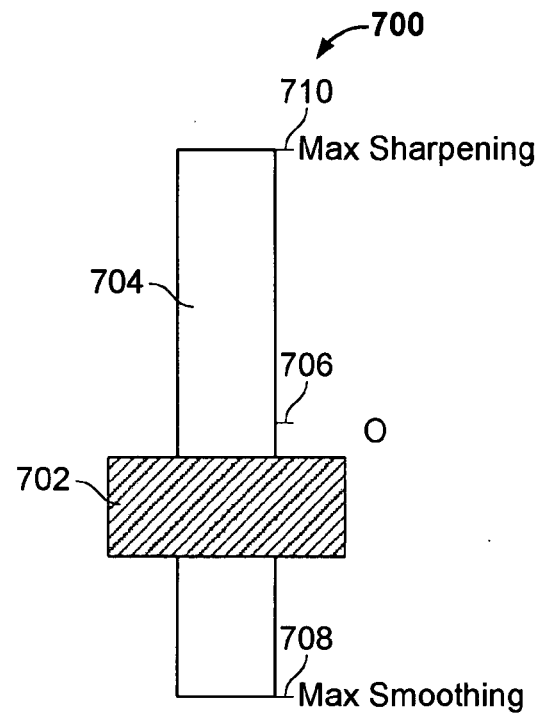
FIG. 7 illustrates a user control provided in one embodiment to enable a user to indicate the degree of sharpening or smoothing desired for a particular audio signal.

FIG. 7 illustrates a user control provided in one embodiment to enable a user to indicate the degree of sharpening or smoothing desired for a particular audio signal. The control 700 comprises a level indicator 702 which may be positioned along a slider 704 to indicate the degree of sharpening and/or smoothing desired. While a slider type control is shown in FIG. 7, any type of control may be used, including without limitation a knob, rocker switch, or any other suitable control. The slider 704 has a null point 706 corresponding in one embodiment to no modification of the audio signal, i.e. the modified spectral magnitudes $S'(\omega,n)$ would be equal to the original magnitudes $S(\omega,n)$. In one embodiment, such a result is achieved by not processing the spectral magnitudes with any nonlinear filter and/or by setting the values of filter coefficients as required to ensure that the output values $S'(\omega,n)$ equal the original values $S(\omega,n)$, such as by setting values $\lambda_1$ and $\lambda_2$ to be equal to zero in equation [2]. The slider 704 has a maximum smoothing position 708 corresponding to a maximum degree of de-emphasis of high modulation frequency portions of the audio signal. In one embodiment, the maximum smoothing position 708 corresponds to maximum values for the coefficients $\lambda_1$ and $\lambda_2$ of the filter corresponding to equation [2], and/or to a maximum value for the exponent a (see equation [1], e.g.). The slider 704 has a maximum sharpening position 710 corresponding to a maximum degree of emphasis of high modulation frequency portions of the signal. In one embodiment the maximum sharpening position 710 corresponds to a maximum value for the exponent $\alpha$, a minimum value for the coefficient $\beta$ in the high-pass filter of Equation [3], and minimum values for the time coefficients $\lambda_3$ and $\lambda_4$ in the artifact smoother of Equation [5].

In one embodiment, intermediate positions between the null position 706 and the maximum positions 708 and 710, respectively, are determined by employing a sound designer to determine one or more set points between the null and respective maximum positions. Such a sound designer may choose intermediate set point values for the coefficients $\lambda_1$ and $\lambda_2$, the exponent $\alpha$, and/or the sharpening/smoothing filter gain, as applicable, to achieve a pleasing listening experience at each set point between the null and respective maximum values, with set points nearer to the null position 706 in one embodiment being characterized by less modification of high modulation frequency portions of the audio signal than set points nearer to one or the other of the maximum positions 708 and 710. Once a sound designer has selected one or more set points between the null position 706 and the respective maximum positions 708 and 710, intermediate values for the coefficients $\lambda_1$ and $\lambda_2$, the exponent $\alpha$, and/or the sharpening/smoothing filter gain, as applicable, corresponding to positions between the set points or between a set point and the null position 706 and/or one of the maximum positions 708 and 710 respectively may be determined using known interpolation techniques. In one embodiment, the interpolation of the underlying values for the coefficients $\lambda_1$ and $\lambda_2$, the exponent $\alpha$, and/or the sharpening/smoothing filter gain, as applicable, corresponding to positions between set points may be either linear or nonlinear, as may be determined to be most appropriate given the set of set points designed by the sound designer.

Figure 8:
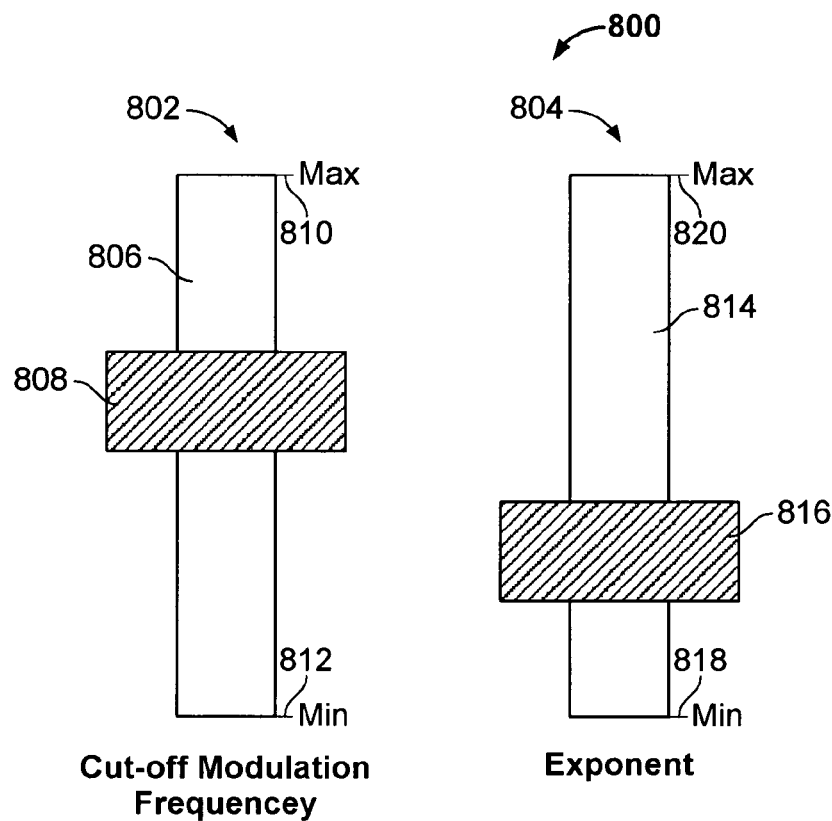
FIG. 8 is an illustration of a set of controls 800 in which separate controls are provided for setting the cut-off modulation frequency and the exponent.

FIG. 8 is an illustration of a set of controls 800 in which separate controls are provided for setting the cut-off modulation frequency and the exponent. The set of controls 800 comprises a cut-off modulation frequency slider control 802 and an exponent slider control 804. The cut-off modulation frequency slider control 802 comprises a cut-off modulation frequency slider 806 and a cut-off modulation frequency level indicator 808 configured to be positioned along the slider 806 to indicate a cut-off modulation frequency between a minimum value corresponding to a minimum cut-off modulation frequency position 812 and a maximum value corresponding to a maximum cut-off modulation frequency position 810. In one embodiment, for smoothing the maximum cut-off modulation frequency position 810 corresponds to a minimum value for the coefficients $\lambda_1$ and $\lambda_2$ of equation [2], which in turn corresponds to a minimum level of modification to the audio signal. In one embodiment, the minimum cut-off modulation frequency position 812 corresponds to a maximum value for the coefficients $\lambda_1$ and $\lambda_2$ in equation [2], which in turn corresponds to a maximum degree of modification of the audio signal. In one embodiment, for sharpening the control 802 is used to control the value of the coefficient $\beta$ in equation [3], in an embodiment in which the value of $\beta$ may be varied.

The exponent slider control 804 comprises a slider 814 and an exponent value indicator 816 configured to be moved along the slider 814 to indicate a desired value for the exponent α. The control 804 comprises a minimum position 818 corresponding to a minimum value for the exponent α and a maximum position 820 corresponding to a maximum value for the exponent α. In one embodiment, the minimum value of α is α=0 (i.e., no modification of the audio signal) and the maximum value is a maximum value greater than 0 as determined by a sound designer.

The systems and methods described herein may in one embodiment be applied selectively to one or more frequency bands (or "bins") associated with the audio signal. In one embodiment, for example, two separate frequency bands may be identified for modification and modifications applied selectively to each frequency band, such that the audio signal may be modified differently in one frequency band than in the other. In one embodiment, each frequency band subject to modification may be defined by a lower and upper boundary frequency.

Figure 9:
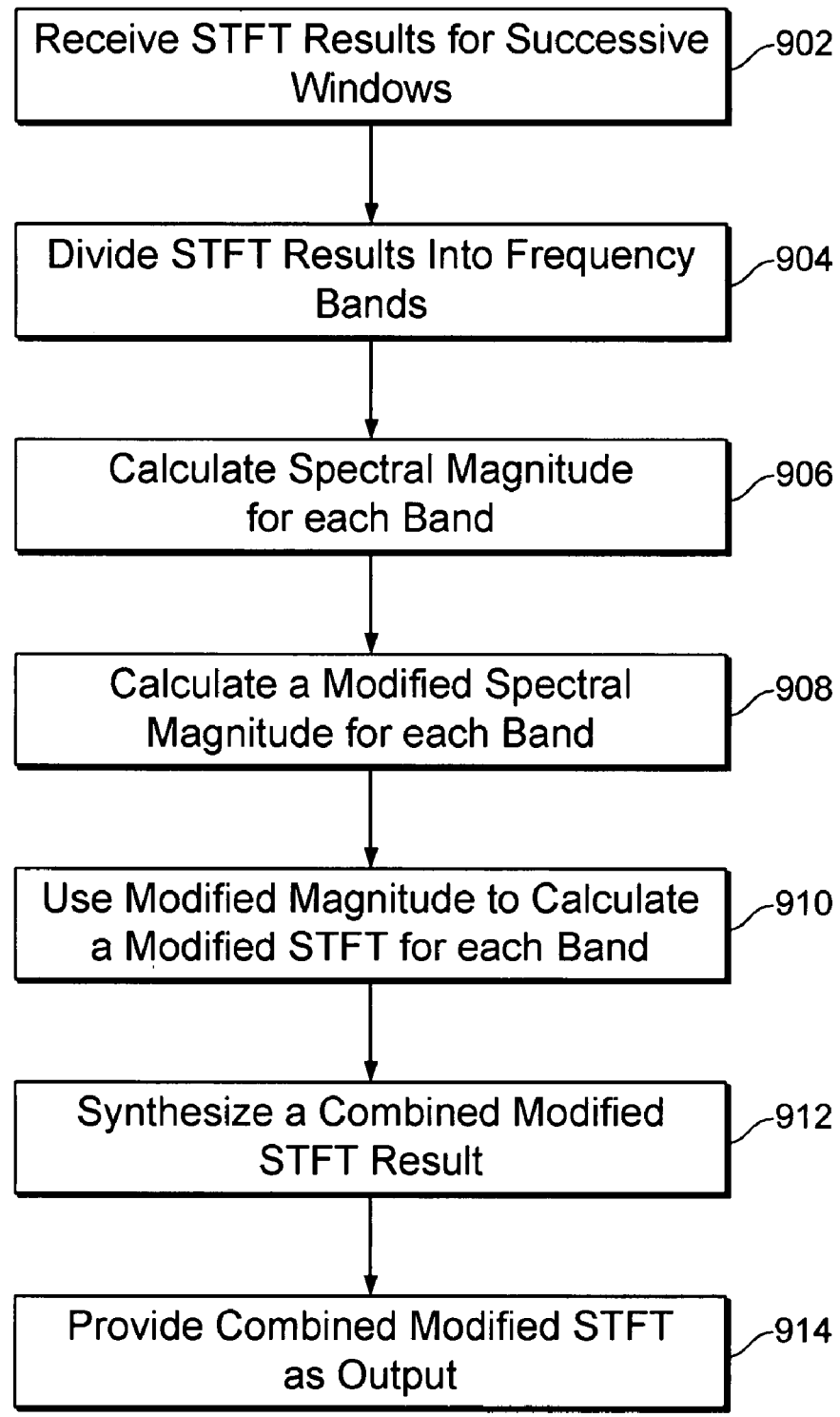
FIG. 9 is a flowchart illustrating a process used in one embodiment to provide modification selectively in two or more frequency bands.

FIG. 9 is a flowchart illustrating a process used in one embodiment to provide modification selectively in two or more frequency bands. In one embodiment, the process shown in FIG. 9 may be used to apply a nonlinear modification to the STFT results for each successive portion of the time-domain audio signal a(t), as in step 106 of FIG. 1. That is, in one embodiment the process shown in FIG. 9 may be used as a substitute to the process shown in FIG. 2 in an embodiment in which the audio signal may be modified differently in two or more frequency bands of interest.

The process shown in FIG. 9 begins in step 902 in which the STFT results for successive portions of the time-domain signal a(t) are received. In step 904, the STFT result for each successive window is divided into the frequency bands of interest. In one embodiment, the STFT results are divided into frequency bands by extracting the values $S(\omega,n)$ for frequencies within the band. In one alternative embodiment, the STFT results are divided into frequency bands by processing the STFT magnitudes $S(\omega,n)$ using a band pass filter frequency response $F_i(\omega)$, such that the spectral content $X_i(\omega,n)$ within the i-th band is determined by the equation $X_i(\omega,n)=F_i(\omega)S(\omega,n)$. In step 906, the spectral magnitude of the STFT result for each successive portion of the time-domain audio signal a(t) is calculated for each frequency band of interest. In step 908, a modified spectral magnitude is calculated for each band. In step 910, the modified spectral magnitude calculated in step 908 for each band is used to calculate a modified STFT result for each band. In one embodiment, step 910 comprises a process similar to that described above in connection with steps 208, 210 and 212 of the process shown in FIG. 2. In step 912, the modified STFT results within each band are synthesized to form a combined modified STFT result for the audio signal. In step 914, the combined modified STFT result synthesized in step 912 is provided as output. In one embodiment, the output provided in step 914 is then processed by applying the inverse STFT, as described above in connection with step 108 of the process shown in FIG. 1, to provide a modified time-domain signal a'(t).

Figure 10:
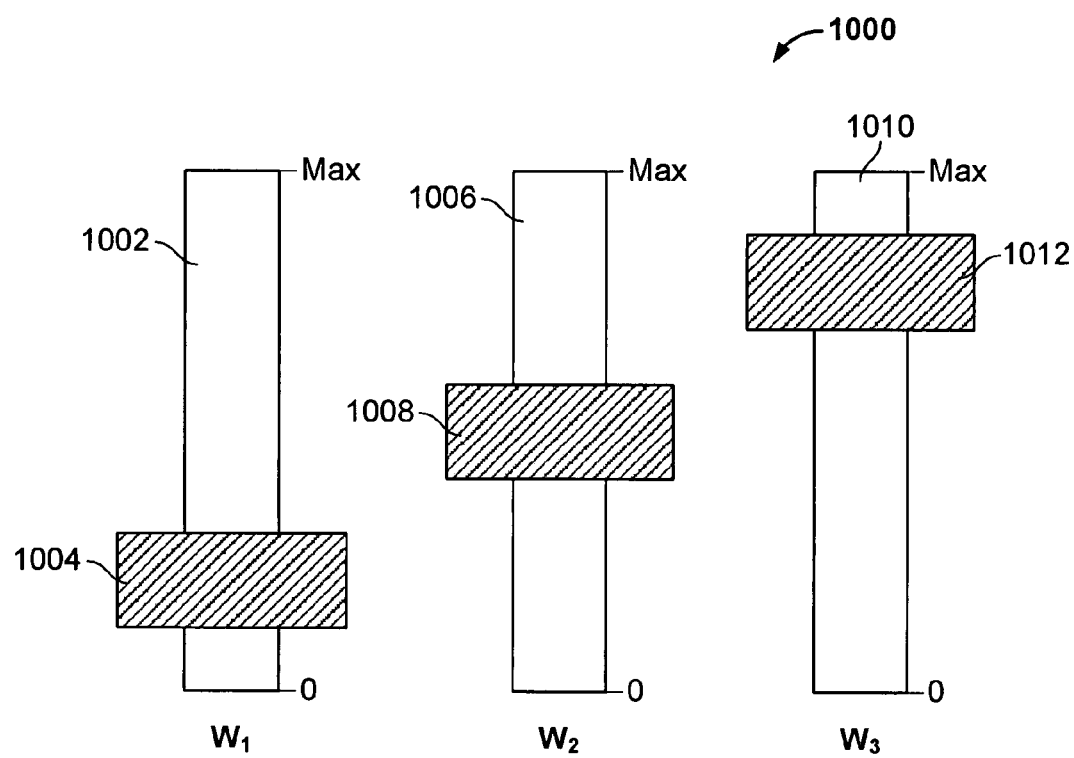
FIG. 10 illustrates a set of boundary frequency controls 1000 provided in one embodiment to enable a user to control the lower and upper limits, respectively, of the frequency bands in an embodiment in which two frequency bands may be defined.

FIG. 10 illustrates a set of boundary frequency controls 1000 provided in one embodiment to enable a user to control the lower and upper limits, respectively, of the frequency bands in an embodiment in which two frequency bands may be defined. The set of controls 1000 comprises a lower boundary frequency slider 1002 associated with a lower frequency boundary indicator 1004 configured to be positioned along the slider 1002 to indicate the lower boundary of the lower frequency band. The set of controls 1000 further comprises a middle boundary frequency slider 1006 associated with a middle boundary frequency indicator 1008 configured to be positioned along the slider 1006 to indicate the upper boundary frequency for the lower frequency band and the lower boundary frequency for the upper frequency band. In one alternative embodiment, the upper boundary of the lower frequency band may be different than the lower boundary of the upper frequency band, and in such an embodiment two separate controls are provided to allow a user to indicate the upper boundary of the lower frequency band and the lower boundary of the upper frequency band respectively. The set of controls 1000 further comprises an upper boundary frequency slider 1010 associated with an upper boundary frequency indicator 1012 configured to be moved along the slider 1010 to indicate the upper boundary of the upper frequency band. In one embodiment, the audio signal is not modified at all with respect to frequencies below the lower boundary $\omega_1$ and above the upper boundary $\omega_3$. In one embodiment, the boundary frequency controls 1000 may be used in connection with other controls, such as those illustrated in FIGS. 7 and 8, to enable a user to control both the definition of the frequency bands and the level of modification within each band. In one embodiment, a control such as the control 700 shown in FIG. 7 is provided for each frequency band. In one embodiment, a set of controls such as the controls 800 of FIG. 8 are provided for each frequency band. While two bands are described above, in other embodiments three or more bands may be used.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method for enhancing an audio signal, comprising:
    processing successive portions of the audio signal using a subband filter bank;
    applying a nonlinear modification to the output of the subband filter bank for each successive portion of the audio signal to generate a modified subband filter bank output for each successive portion; and
    processing the modified subband filter bank output for each successive portion using an appropriate synthesis subband filter bank to generate a modified time-domain audio signal;
    wherein applying a nonlinear modification comprises processing the output of the subband filter bank for successive portions of the audio signal using a filter bank comprising a nonlinear filter the response of which is determined at least in part by a first time constant for portions of the audio signal in which spectral magnitude is increasing and by a second time constant for portions of the audio signal in which spectral magnitude is decreasing.

2. A method for enhancing an audio signal as recited in claim 1, wherein:
    the step of processing successive portions of the audio signal using a subband filter bank comprises performing the short time Fourier transform (STFT) for successive portions of the audio signal to obtain an STFT result for each successive portion; and
    the step of processing the modified subband filter bank output for each successive portion using an inverse of the subband filter bank comprises performing the inverse STFT for the modified STFT result for each successive portion to synthesize a modified time-domain audio signal.

3. A method for enhancing an audio signal as recited in claim 1, wherein applying a nonlinear modification comprises enhancing a portion of the audio signal characterized by a rapid change in spectral content.

4. A method for enhancing an audio signal as recited in claim 3, wherein enhancing a portion of the audio signal characterized by a rapid change in spectral content comprises amplifying the spectral magnitude of the portion of the audio signal characterized by the rapid change in spectral content.

5. A method for enhancing an audio signal as recited in claim 1, wherein applying a nonlinear modification comprises smoothing portions of the audio signal characterized by a rapid change in spectral content.

6. A method for enhancing an audio signal as recited in claim 5, wherein smoothing portions of the audio signal characterized by a rapid change in spectral content comprises reducing the spectral magnitude of the portion of the audio signal characterized by the rapid change in spectral content.

7. A method for enhancing an audio signal as recited in claim 1, wherein the filter bank is configured to enhance high modulation frequency portions of the audio signal.

8. A method for enhancing an audio signal as recited in claim 1, wherein the filter bank comprises a set of parallel nonlinear filters.

9. A method for enhancing an audio signal as recited in claim 1, wherein the filter bank comprises an IIR high-shelf filter.

10. A method for enhancing an audio signal as recited in claim 1, wherein the filter bank comprises an IIR low-shelf filter.

11. A method for enhancing an audio signal as recited in claim 1, wherein the filter bank comprises an FIR sharpener combined with an IIR smoother configured to reduce artifacts.

12. A method for enhancing an audio signal as recited in claim 1, wherein the value of the first time constant is determined at least in part by a user input.

13. A method for enhancing an audio signal as recited in claim 1, wherein applying a nonlinear modification comprises determining a modified spectral magnitude for each successive portion of the audio signal.

14. A method for enhancing an audio signal, comprising:
processing successive portions of the audio signal using a subband filter bank;
applying a nonlinear modification to the output of the subband filter bank for each successive portion of the audio signal to generate a modified subband filter bank output for each successive portion; and
processing the modified subband filter bank output for each successive portion using an appropriate synthesis subband filter bank to generate a modified time-domain audio signal;
wherein applying a nonlinear modification comprises determining a modified spectral magnitude for each successive portion of the audio signal and raising the modified spectral magnitude to an exponent and dividing the result by the corresponding original spectral magnitude to obtain a modification factor.

15. A method for enhancing an audio signal as recited in claim 14, wherein the value of the exponent is determined at least in part by a user input.

16. A method for enhancing an audio signal as recited in claim 14, wherein applying a nonlinear modification further comprises multiplying the original, unmodified output of the subband filter bank for each successive portion of the audio signal by its corresponding modification factor.

17. A method for enhancing an audio signal, comprising:
processing successive portions of the audio signal using a subband filter bank;
applying a nonlinear modification to the output of the subband filter bank for each successive portion of the audio signal to generate a modified subband filter bank output for each successive portion; and
processing the modified subband filter bank output for each successive portion using an appropriate synthesis subband filter bank to generate a modified time-domain audio signal;
wherein applying a nonlinear modification comprises determining a modified spectral magnitude for each successive portion of the audio signal and calculating a modification ratio equal to the modified spectral magnitude divided by the corresponding original spectral magnitude.

18. A method for enhancing an audio signal as recited in claim 17, wherein applying a nonlinear modification further comprises raising the modification ratio to an exponent to determine a modification factor.

19. A method for enhancing an audio signal as recited in claim 18, wherein applying a nonlinear modification further comprises multiplying the original, unmodified output of the subband filter bank for each successive portion of the audio signal by its corresponding modification factor.

20. A method for enhancing an audio signal, comprising:
processing successive portions of the audio signal using a subband filter bank;
applying a nonlinear modification to the output of the subband filter bank for each successive portion of the audio signal to generate a modified subband filter bank output for each successive portion; and
processing the modified subband filter bank output for each successive portion using an appropriate synthesis subband filter bank to generate a modified time-domain audio signal;
wherein the step of applying a nonlinear modification to the output of the subband filter bank for each successive portion of the audio signal comprises:
defining a first frequency band; and
determining a modified spectral magnitude for the output of the subband filter bank for said first frequency band; and
using the modified spectral magnitude to determine a modified subband filter bank output for said first frequency band.

21. A method for enhancing an audio signal as recited in claim 20, wherein the step of applying a nonlinear modification to the output of the subband filter bank for each successive portion of the audio signal further comprises:
defining a second frequency band;
determining a modified spectral magnitude for the output of the subband filter bank for said second frequency band;
using the modified spectral magnitude to determine a modified subband filter bank output for said second frequency band; and
combining the modified subband filter bank output for said first frequency band with the modified subband filter bank output for said second frequency band to obtain a combined modified subband filter bank output for the combined frequency range represented by the first and second frequency bands.

22. A method for enhancing an audio signal as recited in claim 20, further comprising:
    defining an arbitrary number of frequency bands;
    determining a modified spectral magnitude for the output of the subband filter bank for each frequency band;
    using the modified spectral magnitude to determine a modified subband filter bank output for each frequency band; and
    combining the modified subband filter bank outputs for all of the frequency bands to obtain a combined modified subband filter bank output for the combined frequency range represented by the frequency bands.

23. A method for enhancing an audio signal as recited in claim 20, wherein the first frequency band is defined by a lower boundary frequency and an upper boundary frequency.

24. A method for enhancing an audio signal as recited in claim 23, wherein the lower boundary frequency and the upper boundary frequency are fixed parameters.

25. A method for enhancing an audio signal as recited in claim 23, wherein the lower boundary frequency and the upper boundary frequency are variable parameters.

26. A method for enhancing an audio signal as recited in claim 25, wherein the lower boundary frequency and the upper boundary frequency are determined at least in part based on an input from a user.

27. A system for enhancing an audio signal, comprising:
    a data input line configured to receive said audio signal; and
    a processor configured to:
        process successive portions of the audio signal using a subband filter bank;
        apply a nonlinear modification to the output of the subband filter bank for each successive portion of the audio signal to generate a modified subband filter bank output for each successive portion; and
        process the modified subband filter bank output for each successive portion using an appropriate synthesis subband filter bank to generate a modified time-domain audio signal;
    wherein the processor is configured to apply the nonlinear modification to the output of the subband filter bank for each successive portion of the audio signal at least in part by:
        defining a first frequency band; and
        determining a modified spectral magnitude for the output of the subband filter bank for said first frequency band; and
        using the modified spectral magnitude to determine a modified subband filter bank output for said first frequency band.

28. A system for enhancing an audio signal as recited in claim 27, wherein the data input line is configured to receive said audio signal from an external source.

29. A system for enhancing an audio signal as recited in claim 27, wherein the data input line is configured to receive said audio signal from a storage device.

30. A system for enhancing an audio signal as recited in claim 27, wherein the data input line is configured to receive said audio signal from a device configured to read a physical medium on which data associated with the audio signal has been stored.

31. A system for enhancing an audio signal as recited in claim 27, wherein the subband filter bank is configured to perform the short-time Fourier transform on said successive portions of the audio signal.

32. A computer readable medium computer program product for enhancing an audio signal, the computer program product comprising computer instructions for:
    processing successive portions of the audio signal using a subband filter bank;
    applying a nonlinear modification to the output of the subband filter bank for each successive portion of the audio signal to generate a modified subband filter bank output for each successive portion; and
    processing the modified subband filter bank output for each successive portion using an appropriate synthesis subband filter bank to generate a modified time-domain audio signal;
    wherein applying a nonlinear modification to the output of the subband filter bank for each successive portion of the audio signal comprises:
        defining a first frequency band; and
        determining a modified spectral magnitude for the output of the subband filter bank for said first frequency band; and
        using the modified spectral magnitude to determine a modified subband filter bank output for said first frequency band.

* * * * *